(12) United States Patent
Moazzami et al.

(10) Patent No.: US 10,312,928 B2
(45) Date of Patent: *Jun. 4, 2019

(54) SUCCESSIVE APPROXIMATION REGISTER ANALOG-TO-DIGITAL CONVERTER

(71) Applicant: MaxLinear, Inc., Carlsbad, CA (US)

(72) Inventors: Kaveh Moazzami, Carlsbad, CA (US); Pawan Tiwari, Carlsbad, CA (US); Gaurav Chandra, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/983,764

(22) Filed: May 18, 2018

(65) Prior Publication Data

US 2018/0269891 A1  Sep. 20, 2018

Related U.S. Application Data

(63) Continuation of application No. 15/617,515, filed on Jun. 8, 2017, now Pat. No. 10,003,350, which is a
(Continued)

(51) Int. Cl.
*H03M 1/08* (2006.01)
*H03M 1/12* (2006.01)
*H03M 1/46* (2006.01)

(52) U.S. Cl.
CPC ....... *H03M 1/1245* (2013.01); *H03M 1/0836* (2013.01); *H03M 1/12* (2013.01); *H03M 1/46* (2013.01); *H03M 1/468* (2013.01)

(58) Field of Classification Search
CPC .... H03M 1/1245; H03M 1/0836; H03M 1/12; H03M 1/46; H03M 1/468
(Continued)

(56) References Cited

U.S. PATENT DOCUMENTS 6,239,734 B1  5/2001  Bae et al.
6,392,941 B1 *  5/2002  Churchill ............... G11C 29/26
                                                365/201
(Continued)

OTHER PUBLICATIONS

"Analog-to-Digital Converter", Wikipedia, the free encyclopedia, 14 pages, dated Mar. 12, 2014.
(Continued)

*Primary Examiner* — Lam T Mai
(74) *Attorney, Agent, or Firm* — McAndrews, Held & Malloy, Ltd.

(57) ABSTRACT

Aspects of a method and apparatus for converting an analog input value to a digital output code are provided. One embodiment of the apparatus includes a digital-to-analog converter, a comparator, and control logic circuitry. The digital-to-analog converter is configured to generate an analog reference value based on a received digital reference value. The comparator is configured to compare an analog input value to the analog reference value after expiration of an allotted settling time for the digital-to-analog converter and generate a comparison result indicative a relationship between the analog input value and the analog reference value. The control logic circuitry is configured to select the allotted settling time for the digital-to-analog converter based on a bit position of a digital output code to be determined, and update the bit position of the digital output code based on the comparison result.

20 Claims, 5 Drawing Sheets

Related U.S. Application Data continuation of application No. 15/149,827, filed on May 9, 2016, now Pat. No. 9,698,811, which is a continuation of application No. 14/738,143, filed on Jun. 12, 2015, now Pat. No. 9,362,941, which is a continuation of application No. 14/261,870, filed on Apr. 25, 2014, now Pat. No. 9,083,376.

(60) Provisional application No. 61/816,024, filed on Apr. 25, 2013.

(58) Field of Classification Search
USPC .................................................. 341/118–155
See application file for complete search history.

(56) References Cited

U.S. PATENT DOCUMENTS

| | | |
|---|---|---|
| 6,850,180 B2 | 2/2005 | Hales |
| 6,980,140 B1 | 12/2005 | Rowland et al. |
| 7,224,305 B2 | 5/2007 | Haartsen |
| 7,332,916 B2 | 2/2008 | Nagata |
| 7,609,100 B2 | 10/2009 | Nagata |
| 8,362,934 B2 | 1/2013 | Matsuzawa et al. |
| 8,384,578 B2 | 2/2013 | Verbruggen et al. |
| 8,633,846 B2 | 1/2014 | Wu et al. |
| 8,922,415 B2 | 12/2014 | Fogleman et al. |
| 8,928,504 B2 | 1/2015 | Su |
| 8,928,506 B2 * | 1/2015 | Pullela .................. H03M 1/002 341/110 |
| 9,083,376 B2 * | 7/2015 | Moazzami .......... H03M 1/0836 |
| 9,325,319 B1 * | 4/2016 | Mishra ................ H03K 19/094 |
| 9,362,941 B2 | 6/2016 | Moazzami et al. |
| 9,698,811 B2 * | 7/2017 | Moazzami .......... H03M 1/0836 |
| 10,003,350 B2 * | 6/2018 | Moazzami .......... H03M 1/0836 |
| 2005/0162294 A1 * | 7/2005 | Norsworthy ............. H03F 1/22 341/136 |
| 2012/0099630 A1 | 4/2012 | Verhelst et al. |
| 2014/0098908 A1 | 4/2014 | Rangachari et al. |

OTHER PUBLICATIONS

"Digital-to-Analog Converter", Wikipedia, the free encyclopedia, 7 pages, dated Mar. 12, 2014.
U.S. Appl. No. 14/248,851, filed Apr. 9, 2014, Raja Pullela and Curtis Ling, 49 pages.
U.S. Appl. No. 14/246,576, filed Apr. 7, 2014, Curtis Ling, 34 pages.

* cited by examiner

SUCCESSIVE APPROXIMATION REGISTER ANALOG-TO-DIGITAL CONVERTER

CLAIM OF PRIORITY

This Application is a continuation of U.S. patent application Ser. No. 15/617,515, filed Jun. 8, 2017, which is a continuation of U.S. patent application Ser. No. 15/149,827, filed May 9, 2016, now U.S. Pat. No. 9,698,811, issued Jul. 4, 2017, which is a continuation of U.S. patent application Ser. No. 14/738,143, filed Jun. 12, 2015, now U.S. Pat. No. 9,362,941, issued Jun. 7, 2016, which is a continuation of U.S. patent application Ser. No. 14/261,870, filed Apr. 25, 2014, now U.S. Pat. No. 9,083,376, issued Jul. 14, 2015, which patent application makes reference to, claims priority to and claims benefit from the U.S. Provisional Patent Application Ser. No. 61/816,024, filed on Apr. 25, 2013. Each of the above stated applications is hereby incorporated by reference in its entirety.

TECHNICAL FIELD

Aspects of the present application relate to analog-to-digital conversion. More specifically, aspects of the present application relate to successive approximation register (SAR) analog-to-digital converters and methods.

BACKGROUND

Conventional methods and systems for analog to digital conversion can be too slow and/or inaccurate. Further limitations and disadvantages of conventional and traditional approaches will become apparent to one of skill in the art, through comparison of such approaches with some aspects of the present method and system set forth in the remainder of this disclosure with reference to the drawings.

BRIEF SUMMARY

Systems and methods for converting analog input values into digital output codes using successive approximations are substantially shown in and/or described in connection with at least one of the figures, as set forth more completely in the claims.

Aspects and novel features of the present invention, as well as details of an illustrated embodiment thereof, will be more fully understood from the following description and drawings.

DETAILED DESCRIPTION

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. As another example, "x, y, and/or z" means any element of the seven-element set {(x), (y), (z), (x, y), (x, z), (y, z), (x, y, z)}. As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled, or not enabled, by some user-configurable setting.

Figure 1:
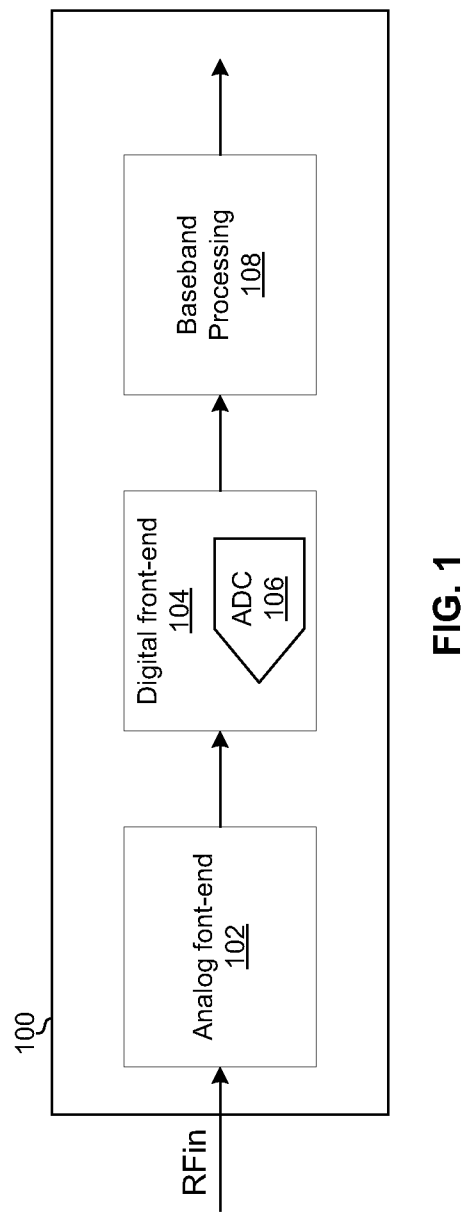
FIG. 1 depicts an example electronic system comprising an analog-to-digital converter (ADC).

FIG. 1 illustrates an example electronic system 100 that may be operable to perform analog-to-digital conversion. The electronic system 100 may comprise suitable circuitry, interfaces, logic and/or code for implementing various aspects of the present disclosure. In this regard, the electronic system 100 may be configured to support performing, executing or running various operations, functions, applications and/or services. For example, the electronic system 100 may be used for executing computer programs, playing video and/or audio content, gaming, communication applications or services (e.g., Internet access/browsing, email, text messaging, chatting and/or voice calling services), and/or networking services (e.g., WiFi hotspot, Bluetooth piconet, and/or active 3G or 4G femtocell data channels).

In some instances, the electronic system 100 may be configured to enable and/or support communication of data. In this regard, the electronic system 100 may communicate with other systems (local or remote), such as during executing, running, and/or performing of operations, functions, applications and/or services supported by the electronic system 100. For example, the electronic system 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the electronic system 100. In this regard, the electronic system 100 may be operable to process transmitted or received signals in accordance with applicable wired or wireless protocols.

Examples of wireless protocols or standards that may be supported may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+ (e.g., GSM/GPRS/EDGE, and IS-95 or cdmaOne) and/or 2G/2G+ (e.g., CDMA2000, UMTS, and HSPA); 4G standards, such as WiMAX (IEEE 802.16) and LTE; Ultra-Wideband (UWB), direct broadcast satellite (DBS), microwave backhaul, and/or the like. Examples of wired protocols and/or interfaces that may be supported may comprise Ethernet (IEEE 802.2), Fiber Distributed Data Interface (FDDI), Integrated Services Digital Network (ISDN), cable (DOCSIS) and Universal Serial Bus (USB) based interfaces. Examples of signal processing operations that may be performed by the electronic system 100 comprise, for example, filtering, amplification, analog-to-digital conversion and/or digital-to-analog conversion, up-conversion/down-conversion of baseband signals, encoding/decoding, encryption/decryption, and/or modulation/demodulation.

In some instances, the electronic system 100 may be configured to enable or support input/output operations, such as to allow user interactions that may control services provided by the electronic system 100. In this regard, the electronic system 100 may comprise components or subsystems for enabling interactions with a user (e.g., end-user or installer), so as to obtain user input and/or to provide user output.

The electronic system 100 may be a stationary system (i.e. being installed at, and/or configured for use only in particular location). In other instances, however, the electronic system 100 may be a mobile device—i.e., intended for use on the move and/or at different locations. In this regard, the electronic system 100 may be designed and/or configured (e.g., as handheld device) to allow for ease of movement, such as to allow it to be readily moved while being held by the user as the user moves, and the electronic system 100 may be configured to perform at least some of the operations, functions, applications and/or services supported on the move.

Examples of electronic systems may comprise handheld electronic devices (e.g., cellular phones, smartphones, or tablets), personal computers (e.g., laptops or desktops), servers, dedicated multimedia devices (e.g., televisions, game consoles, or portable media players), DBS outdoor units, DBS indoor units (e.g., "set-top boxes"), microwave backhaul outdoor units, microwave backhaul indoor units, or other similar receiver systems, and the like. The disclosure, however, is not limited to any particular type of electronic system.

In operation, the electronic system 100 may be operable to perform various operations, functions, applications and/or services. In this regard, in some instances, performing the various, operations, functions, application or services supported by the electronic system 100 may entail performing various processing operations on data handled by the electronic system 100. For example, communication of data, whether over wired or wireless interfaces, may typically comprise transmitting and/or receiving analog signals that are communicated over wireless and/or wired connections. In this regard, typically analog radio frequency (RF) signals may be used to carry data (e.g., content), which may be embedded into the analog signals using analog or digital modulation schemes. For analog communications, data is transferred using continuously varying analog signals, and for digital communications, the analog signals are used to transfer discrete messages in accordance with a particular digitalization scheme.

Handling of digital communications typically includes performing, among other things, analog-to-digital conversion at the receiving end. In this regard, the system 100 may include analog front-end circuitry (AFE) 102, digital front-end circuitry (DFE) 104, and baseband processing circuitry (BBP) 108. The AFE 102 may be operable to, for example, amplify, filter, and down-convert an input RF signal (e.g., an RF signal having a center frequency in the VHF, UHF, L, Ka, and/or Ku band(s)). The DFE 104 may be operable to convert the output of the AFE 102 to a digital representation via ADC 106, filter the digitized signal, and demodulate the digitized signal to recover the underlying baseband signal for output to the BBP 108. The BBP 108 may, for example, perform depacketization, transport stream processing, OSI layer 2 and/or higher-layer processing, and/or the like.

Figure 2:
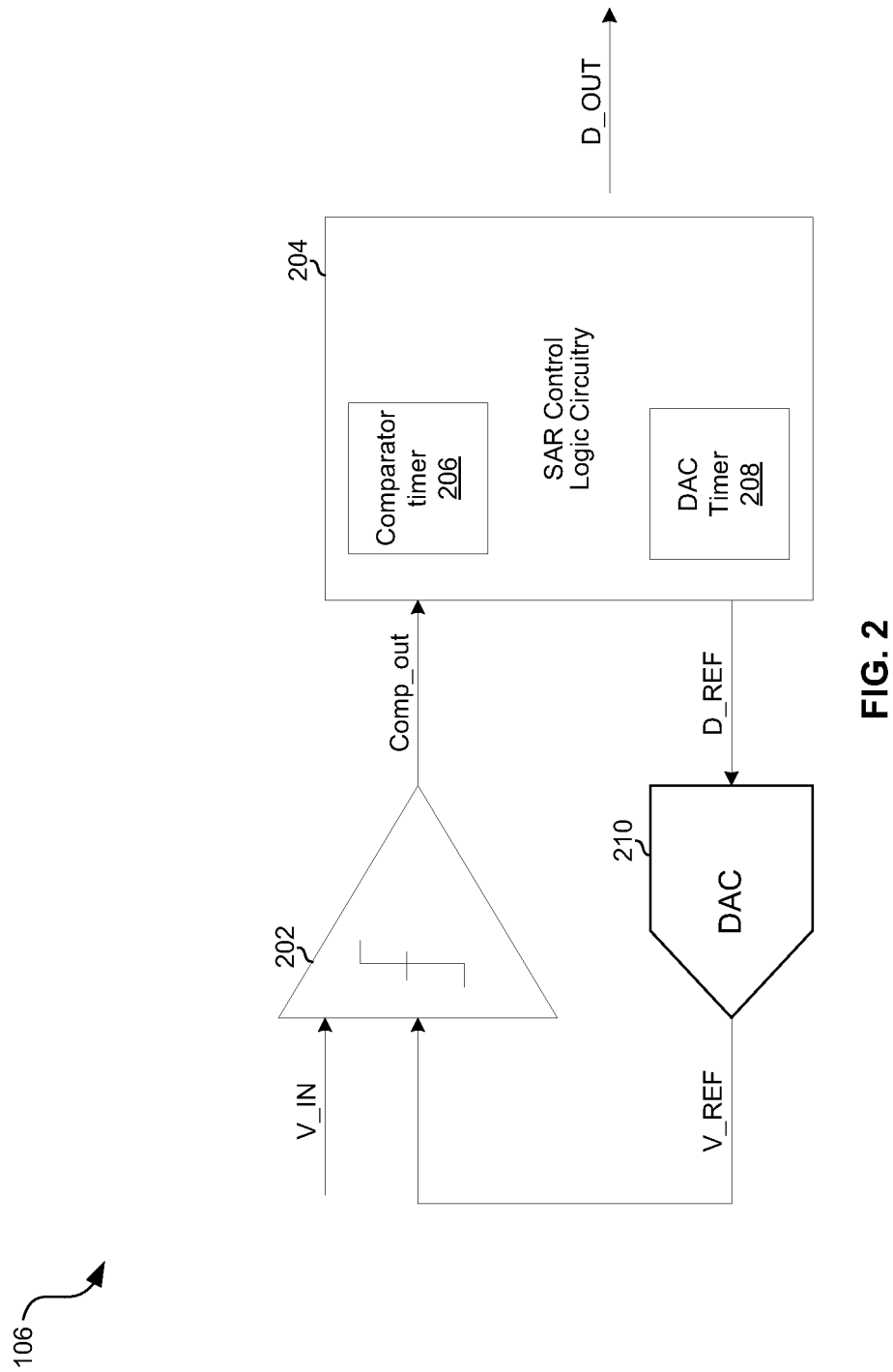
FIG. 2 depicts an example successive approximation register (SAR) ADC implementation of the ADC shown in FIG. 1.

FIG. 2 depicts an example implementation of the ADC 106 as a single-ended successive approximation register (SAR) ADC. A single-ended ADC is depicted for purposes of clarity of illustration. However, it should be appreciated that the present concepts are equally applicable to analog-digital-converters having differential analog inputs that produce a digital output code D_OUT that is representative of the differential analog input value. As shown, the example SAR ADC 106 may include a comparator 202, SAR control logic circuitry 204, and a digital-to-analog converter (DAC) 210. In operation, the SAR control logic circuitry 204 may generate successive approximations or digital reference codes D_REF in search of a digital reference code D_REF that is representative of an analog input value V_IN (although a voltage-mode ADC is shown, aspects of this disclosure also apply to a current-mode ADC). The SAR control logic circuitry 204 may then output the found digital reference code D_REF as a digital output code D_OUT. In this manner, the SAR ADC 200 may convert the analog input value V_IN into a digital output code D_OUT that is representative of the analog input value V_IN.

More specifically, the SAR control logic circuitry 204 may output a digital reference code D_REF to the DAC 210 to cause the DAC 210 to generate a corresponding analog reference value V_REF. The amount of time between the DAC 210 receiving a new digital reference code D_REF and the comparator 202 sampling VREF for a comparison may be referred to as "the DAC settling time". Similarly, the amount of time between the comparator 202 sampling analog reference value V_REF and generating a comparison result COMP_OUT that is representative of relationship between the analog reference value V_REF and the analog input value V_IN may be referred to as "the comparator settling time."

As depicted, the SAR control logic circuitry 204 may include a comparator timer 206 and a DAC timer 208 that respectively determine or allot time to the comparator settling time and the DAC settling time. In an example implementation, the SAR control logic circuitry 204 may allot an amount of time for DAC settling based on which bit of an N-bit conversion is currently being determined. In such an implementation, the SAR control logic circuitry 204 may allot more time for determining bits which result in large voltage swings and thus a lot of charge redistribution in the DAC 210. Conversely, the SAR control logic circuitry 204 may allot less time for determining bits which result in relatively small voltage swings and thus relative small amounts of charge to be redistributed in the DAC 210. For example, for an N-bit conversion, the SAR control logic circuitry 204 may allot a first amount of time T1 for the DAC 210 to settle when determining the most significant bit (MSB) of the digital output code D_OUT, a second amount of time T2 for the DAC 210 to settle when determining bit the second MSB of the digital output code D_OUT, and a third amount of time T3 for the DAC 210 to settle for each remaining bit of the digital output code D_OUT, where T1>T2>T3. Such an example allotment of DAC settling times T1, T2, and T3 is shown in FIG. 5.

Figure 4:
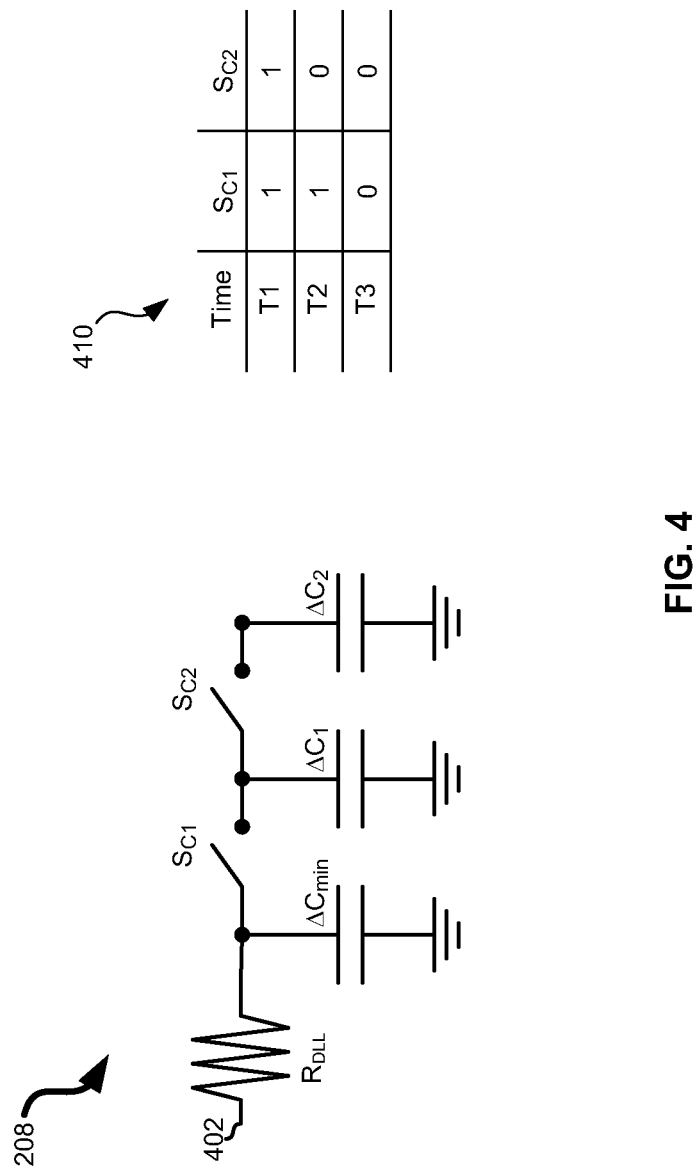
FIG. 4 depicts another example implementation of the DAC settling timer shown in FIG. 2.
Figure 5:
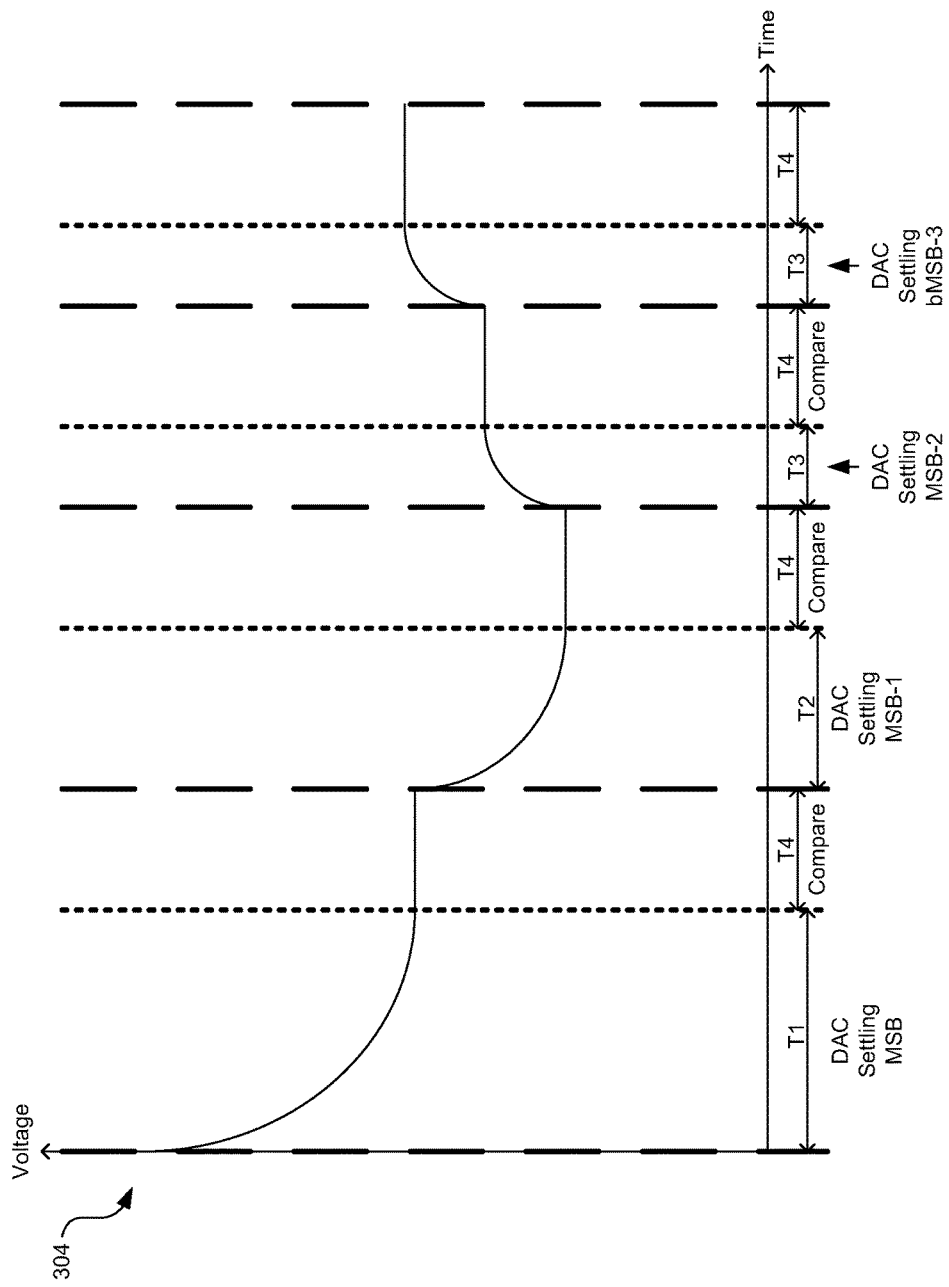
FIG. 5 depicts an example waveform depicting DAC settling times and comparison settling times of the DAC shown in FIG. 2.

The example time allotment depicted in FIG. 5 is just one example of allotting different amounts of DAC settling time to different bits of the digital output code D_OUT. Other combinations of multiple DAC settling times for a single N-bit conversion may be used. Similarly, although the amount of time allotted for comparator settling is shown in FIG. 5 as a uniform period T4, multiple comparator settling times may be used in addition to, or instead of, the non-uniform DAC settling times shown in FIG. 4. In this manner, the SAR ADC 200 may keep the effective number of bits (ENOB) high and dominated by the settling on the MSBs of the digital output code D_OUT while causing the timing margin to be determined mainly by LSBs of the digital output code D_OUT.

Figure 3:
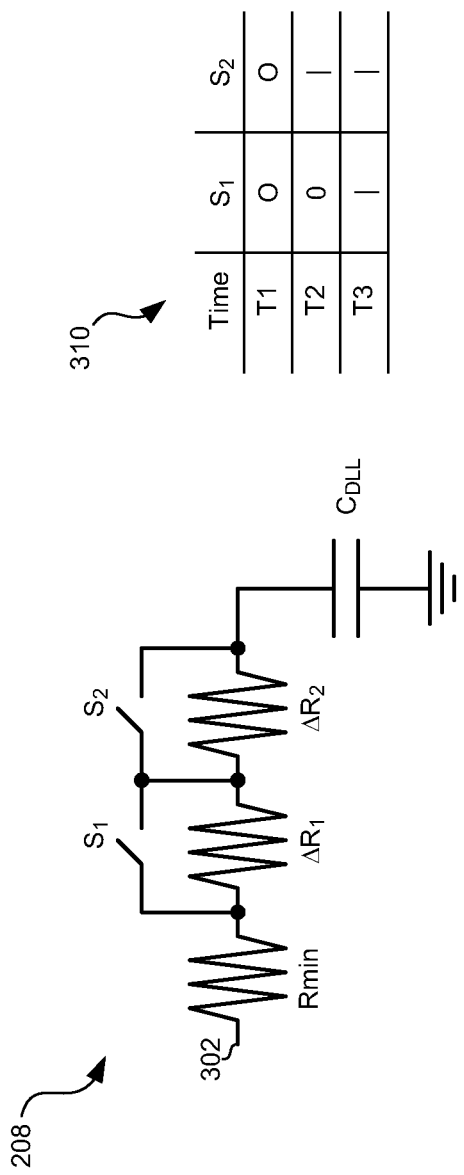
FIG. 3 depicts an example implementation of the DAC settling timer shown in FIG. 2.

FIG. 3 depicts an example implementation of the DAC settling timer 208 of FIG. 2. As shown, the DAC settling timer may include an RC circuit comprising three resistors (or groups of resistors) $R_{min}$, $\Delta R_1$, and $\Delta R_2$, switches S1 and S2, and a capacitor $C_{DLL}$. The time for a voltage applied to terminal 302 to discharge through the DAC settling timer 208 may depend on which of S1 and S2 are closed. The DAC settling timer 208 may, for example, be part of a delay-locked loop (DLL).

In an example implementation, the DAC settling timer 208 may be used for setting the DAC settling time, as follows. The SAR control logic circuitry 204 may adjust RC time constant of the DAC settling timer 208 to obtain an allotted settling time. In particular, the SAR control logic circuitry 204 may open switches S1 and S2 to obtain the maximum RC time constant and thus the maximum settling time, e.g., time T1 of FIG. 4. The SAR control logic circuitry 204 may close switch S2 to short a portion of the resistance and reduce the RC time constant to obtain the DAC settling time T2 of FIG. 4. Similarly, the SAR control logic circuitry 204 may close switches S1 and S2 to short a further portion of the resistance and further reduce the RC time constant to obtain the DAC settling time T3 of FIG. 4. In one embodiment, the total time delay for the SAR control logic circuitry 204 to identify or detect the appropriate DAC settling time to use and to configure switches S1 and S2 accordingly corresponds to one or less than one comparator settling time. Thus, the SAR control logic circuitry 204 may help speed up the SAR conversion of the analog input value V_IN to the digital output code D_OUT while maintaining similar or comparable effective ENOB. The resistance and time constant resulting from switch positions shown in table 310 of FIG. 3 is as follows:

For DAC settling time T1, both switches S1 and S2 are open thus resulting in the time constant being $C_{DLL}*R=C_{DLL}*(Rmin+\Delta R_1+\Delta R_2)$.

For DAC settling time T2, switch S1 is open and switch S2 is closed thus resulting in the time constant being $C_{DLL}*R=C_{DLL}*(Rmin+\Delta R_2)$.

For DAC settling time T3, switch S1 is closed and switch S2 is closed thus resulting in the time constant being $C_{DLL}*R=C_{DLL}*(Rmin)$ FIG. 4 depicts another example implementation of the DAC settling timer 208 of FIG. 2. As shown, the DAC settling timer may include an RC circuit comprising a resistor R, capacitors $\Delta C_{min}$, $\Delta C_1$, $\Delta C_2$, and switches $S_{C1}$ and $S_{C2}$. The time for a voltage applied to terminal 402 to discharge through the DAC settling timer 208 may depend on which of $S_{C1}$ and $S_{C2}$ are closed.

In such an example implementation, the DAC settling timer 208 may be used for setting the DAC settling time, as follows. The SAR control logic circuitry 204 may adjust the RC time constant of the DAC settling timer 208 to obtain an allotted settling time. In particular, the SAR control logic circuitry 204 may close switches S1 and S2 to obtain the maximum RC time constant and thus the maximum settling time, e.g., time T1 of FIG. 4. The SAR control logic circuitry 204 may open switch S2 to remove the capacitance associated with capacitor $\Delta C_2$ and reduce the RC time constant to obtain the DAC settling time T2 of FIG. 4. Similarly, the SAR control logic circuitry 204 may open switches S1 and S2 to remove the capacitances associated with capacitors $\Delta C_1$ and $\Delta C_2$ and further reduce the RC time constant to obtain the DAC settling time T3 of FIG. 4. In one embodiment, the total time delay for the SAR control logic circuitry 204 to identify or detect the appropriate DAC settling time to use and to configure switches $S_{C1}$ and $S_{C2}$ accordingly corresponds to one or less than one comparator settling time. Thus, the SAR control logic circuitry 204 may help speed up the SAR conversion of the analog input value V_IN to the digital output code D_OUT while maintaining similar or comparable effective ENOB. The resistance and time constant resulting from switch positions shown in table 410 of FIG. 4 is as follows:

For DAC settling time T1, both switches S1 and S2 are closed thus resulting in the time constant being $R_{DLL}*C=R_{DLL}*(Cmin+\Delta C_1+\Delta R_2)$.

For DAC settling time T2, switch S1 is closed and switch S2 is opened thus resulting in the time constant being $R_{DLL}*C=R_{DLL}*(Cmin+\Delta C_1)$.

For DAC settling time T3, switch S1 is opened and switch S2 is opened thus resulting in the time constant being $R_{DLL}*C=R_{DLL}*(Cmin)$.

FIGS. 4 and 5 provide implementations of a DAC timer 208 in which a DAC settling time is set or obtained by adjusting an RC value associated with the DAC timer 208. In particular, the implementation of FIG. 4 uses a variable resistance and a constant capacitance to obtain the desired RC time constant. Conversely, the implementation of FIG. 5 uses a variable capacitance and a constant resistance to obtain the desired RC time constant. Other embodiments of the DAC timer 208 may utilize both variable resistance and variable capacitance to obtain the desire RC time constant. In yet other embodiments, the DAC timer 208 may obtain the desired DAC settling time via other approaches. For example, the DAC timer 208 may include digital counters or other circuitry to obtain the desired DAC settling time. Moreover, the DAC timer 208 in yet further embodiments may adjust timing parameters of one or more other circuit elements in order to effectively obtain the DAC settling time.

In accordance with an embodiment of the invention, a method may include converting an analog input value V_IN to a digital output code D_OUT. The method may include selecting a settling time (e.g., T1, T2, or T3) for a digital-to-analog converter (DAC) 210 based on a bit position of the digital output code D_OUT being determined. The method may also include comparing an analog reference value V_REF generated by the DAC 210 in response to expiration of the selected settling time (e.g., T1, T2, or T3) for the DAC 210. The method may further include updating the bit position of the digital output code D_OUT based on a comparison result COMP_OUT of the comparing. The method may also include providing the DAC 210 with a digital reference code D_REF that corresponds to an approximation of the analog input value V_IN, and generating the analog reference value V_REF with the DAC 210 based upon the digital reference code D_REF. The method may further include sampling the analog reference value V_REF after expiration of the selected settling time (e.g., T1, T2, or T3), and updating the bit position a comparator settling time (e.g., T4) after sampling the analog reference value V_REF. In some embodiments, the method may update the bit position after expiration of a uniform comparator settling time (e.g., T4).

In some embodiments, the selecting a settling time may include selecting a greater settling time for a most significant bit of the digital output code than for a least significant bit of the digital output code. In other embodiments, the selecting a settling time may include selecting a greater settling time for a most significant bit of the digital output code than for a second most significant bit of the digital output code. In yet other embodiments, the selecting a settling time may include selecting a greater settling time for one bit of the digital output code than for another bit of the digital output code, wherein the one bit is a more significant bit than the another bit.

In accordance with some embodiments of the invention, the selecting a settling time may include adjusting a time constant of an RC circuit to obtain the selected settling time, or adjusting an effective resistance value of an RC circuit to obtain the selected settling time. The adjusting may include selectively actuating one or more switches to short circuit one resistors of the RC circuit to obtain the selected settling time.

In accordance with other embodiments of the invention, an apparatus may convert an analog reference value V_IN to a digital output code D_OUT. To this end, the apparatus may include a digital-to-analog converter (DAC) 210, a comparator 202, and control logic circuitry 204. The DAC 210 may be configured to generate an analog reference value V_REF based on a received digital reference value D_REF. The comparator may be configured to compare the analog input value V_IN to the analog reference value V_REF after expiration of an allotted settling time (e.g., T1, T2, or T3) for the DAC 210 and generate a comparison result COMP_OUT indicative a relationship between the analog input value V_IN and the analog reference value V_REF. The control logic circuitry may be configured to select the allotted settling time (e.g., T1, T2, or T3) for the DAC 210 based on a bit position of the digital output code D_OUT to be determined, and update the bit position of the digital output code D_OUT based on the comparison result COMP_OUT.

In some embodiments, the comparator 202 may be configured to sample the analog reference value V_REF after expiration of the allotted settling time, and the control logic circuitry 204 may be configured to update the bit position a comparator settling time after sampling the analog reference value V_REF. More specifically, the control logic circuitry, in some embodiments, may be configured to update the bit position after expiration of a uniform comparator settling time.

The apparatus may also include a DAC timer 208 configured to specify the allotted settling time for the DAC 210. The DAC timer 208 may include an RC circuit, and the control logic circuitry 204 may be configured to adjust a time constant of the RC circuit to obtain the allotted settling time for the DAC 210. In particular, the DAC timer 208 may include one or more switches that are configured to short circuit one or more resistors of an RC circuit, and the control logic circuitry 204 may be configure to selectively actuate the one or more switches to short circuit the one or more resistors of the RC circuit to obtain the allotted settling time for the DAC 210.

In some embodiments, the control logic circuitry may be configured to allot a greater settling time for a most significant bit of the digital output code than for a least significant bit of the digital output code, allot a greater settling time for a most significant bit of the digital output code than for a second most significant bit of the digital output code, or allot a greater settling time for one bit of the digital output code than for another bit of the digital output code, wherein the one bit is a more significant bit than the another bit.

Other implementations may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes described herein.

Accordingly, the present method and/or system may be realized in hardware, software, or a combination of hardware and software. The present method and/or system may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

The present method and/or system may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed is:

1. A method of converting an analog input signal to a digital output code, the method comprising:
    allotting time to a digital-to-analog converter based on an expected voltage swing magnitude of an analog reference signal generated by the digital-to-analog converter;
    generating, with the digital-to-analog converter, the analog reference signal to be representative of a digital reference code;
    comparing the analog input signal to the analog reference signal in response to expiration of the time allotted to the digital-to-analog converter; and
    updating one or more bit positions of the digital output code based on said comparing.

2. The method of claim 1, wherein said allotting comprises allotting the time such that the time allotted is greater in response to the expected voltage swing magnitude having a first magnitude than in response to the expected voltage swing magnitude having a second magnitude that is less than the first magnitude.

3. The method of claim 1, wherein said allotting comprises allotting the time such that the time is increased as the expected voltage swing magnitude increases.

4. The method of claim 1, wherein said allotting comprises adjusting a time constant for an RC circuit of a timer that tracks the time allotted to the digital-to-analog converter.

5. The method of claim 1, wherein said allotting comprises adjusting an effective resistance value for an RC circuit of a timer that tracks the time allotted to the digital-to-analog converter.

6. The method of claim 1, wherein said allotting comprises selectively actuating one or more switches to short circuit one or more resistors from an RC circuit of a timer that tracks the time allotted to the digital-to-analog converter.

7. The method of claim 1, wherein said allotting comprises adjusting an effective capacitance value for an RC circuit of a timer that tracks the time allotted to the digital-to-analog converter.

8. The method of claim 1, wherein said allotting comprises selectively opening one or more switches to effectively remove one or more capacitors from an RC circuit of a timer that tracks the time allotted to the digital-to-analog converter.

9. The method of claim 1, wherein said allotting comprises adjusting a digital counter of a timer that tracks the time allotted to the digital-to-analog converter.

10. The method of claim 1, wherein:
said comparing comprises comparing the analog input signal to the analog reference signal using a comparator of an analog-to-digital converter; and
said updating comprises sampling a comparison output of the comparator in response to expiration of a second time allotted to the comparator, and updating the one or more bit positions of the digital output code based on the comparison output.

11. An apparatus, comprising:
a digital-to-analog converter configured to generate an analog reference signal based on a digital reference code;
a timer that tracks time allotted to the digital-to-analog converter;
a comparator configured to compare an analog input signal to the analog reference signal in response to expiration of the time allotted to the digital-to-analog converter; and
control logic circuitry configured to allot the time to the digital-to-analog converter based on an expected voltage swing magnitude of the analog reference signal generated by the digital-to-analog converter, and update one or more bit positions of a digital output code based on a comparison output of the comparator.

12. The apparatus of claim 11, wherein the control logic circuitry is further configured to allot the time such that the time allotted is greater in response to the expected voltage swing magnitude having a first magnitude than in response to the expected voltage swing magnitude having a second magnitude that is less than the first magnitude.

13. The apparatus of claim 11, wherein the control logic circuitry is further configured to allot the time such that the time is increased as the expected voltage swing magnitude increases.

14. The apparatus of claim 11, wherein:
the timer comprises an RC circuit; and
the control logic circuitry is further configured to adjust the time allotted to the digital-to-analog converter by adjusting a time constant of the RC circuit.

15. The apparatus of claim 11, wherein:
the timer comprises an RC circuit; and
the control logic circuitry is further configured to allot the time to the digital-to-analog converter by adjusting an effective resistance value of the RC circuit.

16. The apparatus of claim 11, wherein:
the timer comprises one or more switches configured to short circuit one or more resistors of an RC circuit; and
the control logic circuitry is further configured to allot the time to the digital-to-analog converter by selectively actuating the one or more switches to short circuit the one or more resistors of the RC circuit.

17. The apparatus of claim 11, wherein:
the timer comprises an RC circuit; and
the control logic circuitry is further configured to allot the time to the digital-to-analog converter by adjusting an effective capacitance value of the RC circuit.

18. The apparatus of claim 17, wherein:
the timer comprises one or more switches; and
the control logic circuitry is further configured to allot the time to the digital-to-analog converter by selectively opening the one or more switches to effectively remove one or more capacitors from the RC circuit.

19. The apparatus of claim 11, wherein:
the timer comprises a digital counter; and
the control logic circuitry is further configured to allot the time to the digital-to-analog converter by adjusting the digital counter.

20. The apparatus of claim 11, further comprising:
a second timer that tracks a second time allotted to the comparator;
wherein the control log circuitry is configured to sample the comparator output in response to expiration of the second time allotted to the comparator.

* * * * *